United States Patent
Kurihara et al.

(10) Patent No.: US 11,321,166 B2
(45) Date of Patent: May 3, 2022

(54) DEVICE FOR DETERMINING SOFT ERROR OCCURRED IN A MEMORY HAVING STACKED LAYERS, AND COMPUTER READABLE MEDIUM STORING PROGRAM THEREON FOR DETERMINING THE SOFT ERROR

(71) Applicant: FANUC CORPORATION, Yamanashi (JP)

(72) Inventors: Kenichiro Kurihara, Yamanashi (JP); Shinji Akimoto, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 17/023,371

(22) Filed: Sep. 17, 2020

(65) Prior Publication Data
US 2021/0103492 A1 Apr. 8, 2021

(30) Foreign Application Priority Data

Oct. 3, 2019 (JP) .............................. JP2019-182808

(51) Int. Cl.
*G06F 11/07* (2006.01)
*G06F 11/10* (2006.01)
*G01R 31/3181* (2006.01)

(52) U.S. Cl.
CPC ...... *G06F 11/1004* (2013.01); *G06F 11/1048* (2013.01); *G01R 31/31816* (2013.01)

(58) Field of Classification Search
CPC ............. G06F 11/1004; G06F 11/1048; G06F 11/1052; G01R 31/31816; G11C 29/44
See application file for complete search history.

(56) References Cited

U.S. PATENT DOCUMENTS

| 7,437,597 B1* | 10/2008 | Kruckemyer | ....... G06F 11/1064 714/6.11 |
| 11,023,323 B2* | 6/2021 | Rao | ......................... G01S 7/352 |

(Continued)

FOREIGN PATENT DOCUMENTS

| JP | H5225077 A | 9/1993 |
| JP | 2018128820 A | 8/2018 |
| JP | 201967469 A | 4/2019 |

OTHER PUBLICATIONS

Design of a fault-tolerant three-dimensional dynamic random-access memory with on-chip error-correcting circuit by Mazumder published by IEEE Transactions on Computers 42.12: 1453-1468. (Dec. 1, 1993) https://ieeexplore.ieee.org/stamp/stamp.jsp?arnumber=260635 (Year: 1993).*

*Primary Examiner* — Joseph O Schell
(74) *Attorney, Agent, or Firm* — Hauptman Ham, LLP

(57) ABSTRACT

The memory error determination device includes a processor configured to: detect a memory element in which an error has occurred in each of a plurality of layers included in a memory being three-dimensionally stacked, specify a position of each memory element in which the error has occurred in each of the plurality of layers, and determine that, when the position of each memory element in which the error has occurred is linearly aligned across a predetermined number of layers among the plurality of layers, the predetermined number being two or more, an error that has occurred in the memory is a soft error due to radiation incident on the memory.

10 Claims, 5 Drawing Sheets

(56) References Cited

U.S. PATENT DOCUMENTS

| | | | |
|---|---|---|---|
| 2005/0172207 A1* | 8/2005 | Radke | G06F 11/1008 |
| | | | 714/763 |
| 2008/0165521 A1* | 7/2008 | Bernstein | H01L 21/8221 |
| | | | 361/820 |
| 2009/0199056 A1* | 8/2009 | Murata | G11C 29/44 |
| | | | 714/704 |
| 2010/0192041 A1* | 7/2010 | Jeddeloh | H01L 27/10897 |
| | | | 714/763 |
| 2011/0066918 A1* | 3/2011 | Ramaraju | G06F 11/1012 |
| | | | 714/757 |
| 2011/0275356 A1* | 11/2011 | Best | H04W 36/385 |
| | | | 455/414.1 |
| 2014/0250345 A1* | 9/2014 | Lee | G06F 11/1012 |
| | | | 714/763 |
| 2016/0124810 A1* | 5/2016 | Yang | G11C 29/42 |
| | | | 714/764 |
| 2016/0284424 A1* | 9/2016 | Das | G11C 29/52 |
| 2016/0335145 A1* | 11/2016 | Toba | G06F 11/0754 |
| 2018/0052615 A1* | 2/2018 | Russell | G06F 11/106 |
| 2019/0102316 A1* | 4/2019 | Hara | G11C 8/12 |
| 2020/0379842 A1* | 12/2020 | Ross | G11C 11/1657 |

* cited by examiner

DEVICE FOR DETERMINING SOFT ERROR OCCURRED IN A MEMORY HAVING STACKED LAYERS, AND COMPUTER READABLE MEDIUM STORING PROGRAM THEREON FOR DETERMINING THE SOFT ERROR

RELATED APPLICATIONS

The present application claims priority to Japanese Application Number 2019-182808, filed Oct. 3, 2019, the disclosure of which is hereby incorporated by reference herein in its entirety.

FIELD

The present invention relates to a memory error determination device and a memory error determination computer program that determine a cause of an error that occurs in a memory being three-dimensionally stacked, for example.

BACKGROUND

It has been known that radiation is incident on a memory being three-dimensionally stacked and collides with a silicon atom in the memory to generate a secondary ion, and an electron driven out of the silicon atom on a trajectory of the secondary ion inverts an electric charge in a memory cell, thereby causing a soft error in the memory. Thus, a technique for improving resistance against a soft error due to such radiation has been proposed (for example, see Japanese Unexamined Patent Publication (Kokai) No. 2019-67469 (hereinafter, referred to as Patent Literature 1)). In this technique, when N pieces of data are written to a memory system including N vertically stacked core dies in which N memory circuits having the same structure are each mounted, the data are stored in a write address varying with the memory circuit.

Further, in an FPGA, a technique for preventing unnecessary stop by continuing driving of a control device when a detected position of a soft error is an unused part of a functional unit, and on the other hand, by executing predetermined processing when a position of a soft error is a used part of the functional unit has been proposed (for example, see Japanese Unexamined. Patent Publication (Kokai) No. 2018-128820 (hereinafter, referred to as Patent Literature 2)). Furthermore, in a memory that holds an FCC, a technique for determining, when a 1-bit error occurs in the memory, whether the error is a hard error or a soft error, and causing a CPU to make a notification by an interrupt when the hard error occurs has been proposed (for example, see Japanese Unexamined Patent Publication (Kokai) No. H05-225077 (hereinafter, referred to as Patent Literature 3)).

SUMMARY

When some sort of error occurs in a memory, it is preferable that a cause of the error can be accurately determined. This is because an appropriate measure can be taken against a memory in which an error occurs when a cause of the error can be accurately determined. Particularly, a soft error due to radiation occurs even without a failure in a memory itself, and thus it is useful to determine whether or not an error that has occurred is the soft error due to the radiation. However, the technique described in Patent Literature 1 and the technique described in Patent Literature 2 do not determine, even when some sort of error occurs in a memory, a cause of the error. Further, the technique described in Patent Literature 3 determines whether a 1-bit error that has occurred in a memory is a hard error or a soft error, but does not determine a cause of the error.

In one aspect, an object is to provide a memory error determination device capable of determining whether or not an error that has occurred in a memory being three-dimensionally stacked is caused by radiation incident on the memory.

According to one embodiment, a memory error determination device is provided. The memory error determination device includes a processor configured to: detect a memory element in which an error has occurred in each of a plurality of layers included in a memory being three-dimensionally stacked; specify a position of each memory element in which the error has occurred in each of the plurality of layers; and determine that, when the position of each memory element in which the error has occurred is linearly aligned across a predetermined number of layers among the plurality of layers, the predetermined number being two or more, the error that has occurred in the memory is a soft error due to radiation incident on the memory.

According to another embodiment, a non-transitory recording medium that stores a memory error determination computer program is provided. The memory error determination computer program includes an instruction causing a computer to execute: detecting a memory element in which an error has occurred in each of a plurality of layers included in a memory being three dimensionally stacked; specifying a position of each memory element in which the error has occurred in each of the plurality of layers; and determining that, when the position of each memory element in which the error has occurred is linearly aligned across a predetermined number of layers among the plurality of layers, the predetermined number being two or more, the error that has occurred in the memory is a soft error due to radiation incident on the memory.

According to one aspect, whether or not an error that has occurred in a memory being three-dimensionally stacked is a soft error due to radiation incident on the memory can be determined.

DESCRIPTION OF EMBODIMENTS

Hereinafter, a memory error determination device and a memory error determination computer program operating in the memory error determination device will be described with reference to the drawings. The memory error determination device determines whether or not an error that occurs in a memory being three-dimensionally stacked, i.e., a memory including a plurality of layers in which memory elements are two-dimensionally aligned, is caused by radiation incident on the memory (for example, an α ray, a β ray, a γ ray, a neutron beam, an X ray). The inventors of the present application have noticed that, when radiation is incident on a memory, an error may occur in a memory element along a trajectory of the radiation. Thus, when the memory error determination device writes data to each layer of the memory being three-dimensionally stacked, the memory error determination device encodes the data by an error correction code or an error detection code. When it is detected by the error correction code or the error detection code that an error occurs across the plurality of layers of the memory, the memory error determination device determines whether or not each memory element in which the error has occurred is linearly aligned. Then, when each memory element in which the error has occurred is linearly aligned, the memory error determination device determines that the error is a soft error due to the radiation incident on the memory.

Figure 1:
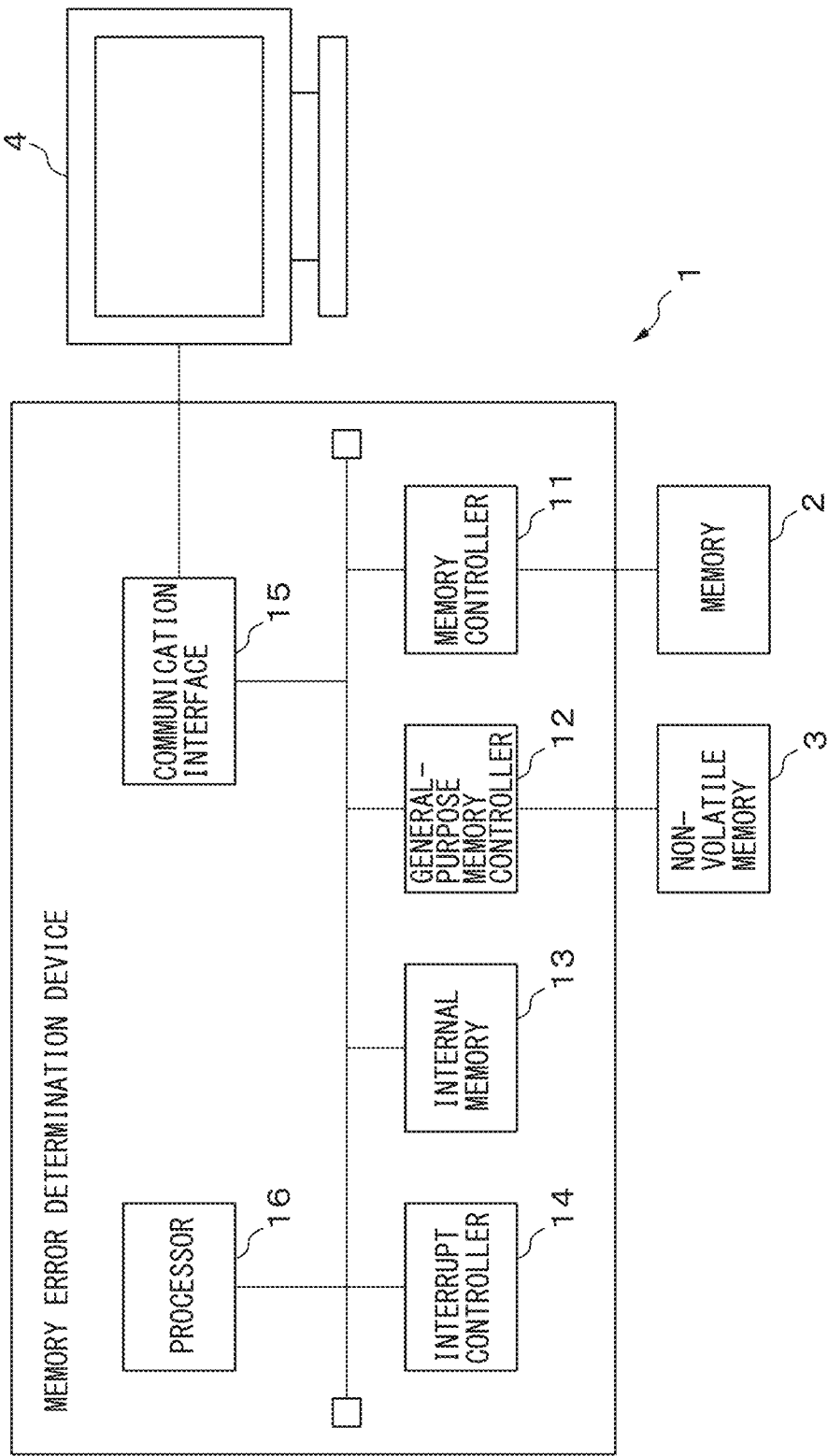
FIG. 1 is a schematic configuration diagram of a memory error determination device.

FIG. 1 is a schematic configuration diagram of the memory error determination device. A memory error determination device 1 is mounted on, for example, a machine tool subjected to computer numerical control, a machine such as a robot, or a computer. The memory error determination device 1 includes a memory controller 11 for controlling a memory 2 that is a determination target of a cause of an error and is three-dimensionally stacked, a general-purpose memory controller 12, an internal memory 13, an interrupt controller 14, a communication interface 15, and a processor 16. Each of the units included in the memory error determination device 1 is mounted as a dedicated circuit for executing processing of each of the units in one integrated circuit, for example. In other words, the memory error determination device 1 itself is constituted as one processor unit. Alternatively, each of the units included in the memory error determination device 1 may be constituted as a separate circuit. Furthermore, each of the units included in the memory error determination device 1 is communicably connected to one another via a signal line such as a bus, for example.

In the present embodiment, the memory 2 that is a determination target of a cause of an error and is three-dimensionally stacked is a 3D dynamic random access memory (3D-DRAM) including a plurality of layers of memory elements being two-dimensionally aligned, and stores various types of data used in an application executed in a device in which the memory error determination device 1 is incorporated, for example. Note that the memory 2 is not limited to the 3D-DRAM and may be a memory being three-dimensionally stacked, and may be, for example, a NAND-type flash memory (registered trademark) being three-dimensionally stacked.

The memory controller 11 is connected to the memory 2, and controls the memory 2 in accordance with an instruction from the processor 16. In other words, the memory controller 11 writes, to the memory 2, data received from the processor 16 and encoded by an error detection code or an error correction code. Alternatively, the memory controller 11 reads encoded data from the memory 2, and passes the read data to the processor 16. Furthermore, the memory controller 11 executes refresh processing of the memory 2. Note that the processor 16 executes encoding of data stored in the memory 2 in the present embodiment, but the memory controller 11 may encode data stored in the memory 2.

The general-purpose memory controller 12 is connected to a non-volatile memory 3, and controls the non-volatile memory 3 in accordance with an instruction from the processor 16. Note that the non-volatile memory 3 is one example of a storage unit, and stores, for example, a computer program for memory error determination processing and various types of information used in the memory error determination processing. Note that the information used in the memory error determination processing includes a position table representing, for each memory element of the memory 2, a correspondence between a hit address of the memory element and positional coordinates of the memory element in a three-dimensional space. Furthermore, the non-volatile memory 3 may store a boot computer program and information to which the boot computer program refers. In other words, the general-purpose memory controller 12 reads the boot computer program and the like from the non-volatile memory 3 in accordance with an instruction from the processor 16 or the interrupt controller 14, and passes the read program and the like to the processor 16.

The internal memory 13 is another example of the storage unit, and is, for example, a static random access memory (SRAM), and temporarily stores data used by an application executed by the processor 16, data generated during the memory error determination processing, information read from the non-volatile memory 3, or the like.

The interrupt controller 14 executes interrupt processing. In the present embodiment, for example, when the processor 16 executes an application operating on the processor 16, the interrupt controller 14 executes the interrupt processing upon detection of an error that occurs in the memory 2 and cannot be automatically corrected (hereinafter, referred to as an uncorrectable error). At this time, the interrupt controller 14 instructs the processor 16 to execute the memory error determination processing. Note that the interrupt controller 14 itself may execute the memory error determination processing described below.

The communication interface 15 is an interface for connecting the memory error determination device 1 with a display device 4 such as a liquid crystal display being one example of a notification unit, an input device (not illustrated) such as a keyboard, and an external storage device (not illustrated) such as a hard disk device. The communication interface 15 outputs, for example, information that is received from the processor 16 and represents a determination result of a cause of an error that has occurred in the memory 2 (for example, a message representing the determination result), and the like to the display device 4 or the external storage device. Further, the communication interface 15 passes an operation signal received from the input device and the like to the interrupt controller 14 or the processor 16.

Note that the external storage device may store the position table. In this case, the external storage device is another example of the storage unit, and the communication interface 15 reads the position table from the external storage device in accordance with an instruction from the processor 16, and passes the read position table to the processor 16.

The processor 16 includes, for example, one Cr a plurality of microprocessor units (MPU s), and executes various types of applications related to a device in which the memory error determination device 1 is mounted. Further, the processor 16 executes the memory error determination processing on the memory 2. Further, when the processor 16 executes various types of processing, the processor 16 writes data and the like used in the processing to the memory 2 or the internal memory 13 as necessary, or reads data and the like used in the processing from the memory 2, the non-volatile memory 3, or the internal memory 13. Note that the memory controller 11 may execute the memory error determination processing described below.

Figure 2:
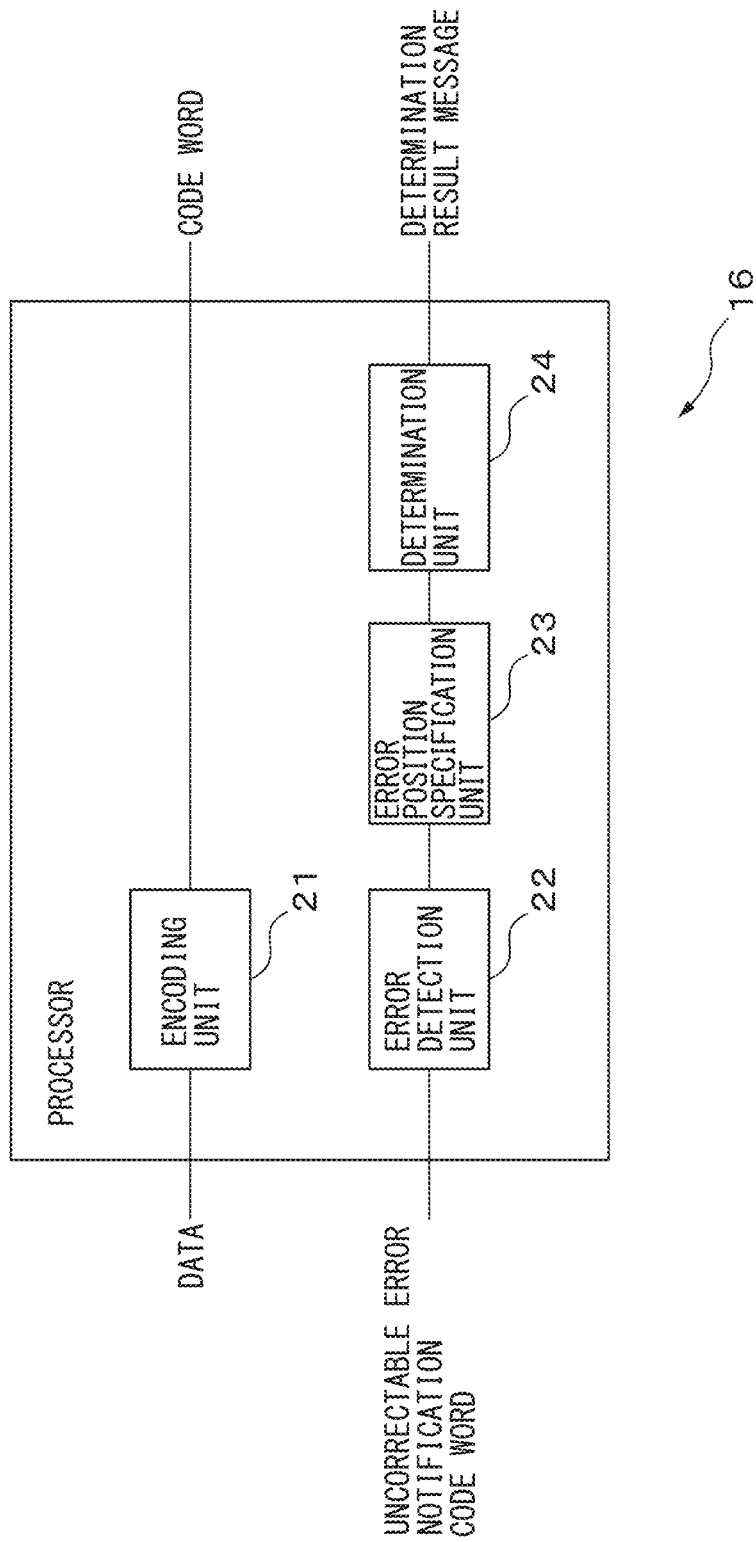
FIG. 2 is a functional block diagram of a processor, relating to memory error determination processing.

FIG. 2 is a functional block diagram of the processor 16, relating to the memory error determination processing. The processor 16 includes an encoding unit 21, an error detection unit 22, an error position specification unit 23, and a determination unit 24. Each of the units included in the processor 16 is, for example, a software module achieved by a computer program executed on the processor 16. Alternatively, each of the units included in the processor 16 may be a dedicated arithmetic circuit provided in the processor 16. Further, among each of the units included in the processor 16, the error detection unit 22, the error position specification unit 23, and the determination unit 24 execute the memory error determination processing.

When the encoding unit 21 writes data to the memory 2 in accordance with an application operating on the processor 16, the encoding unit 21 divides the data into bit strings having a predetermined bit length, and encodes each of the bit strings by using an error correction code (FCC) or an error detection code (EDC) to generate a code word. In the present embodiment, the encoding unit 21 uses, for encoding a bit string, a single-bit error correction double-bit error detection (SECDED) code having an error detection capacity of 2 bits and an error correction capacity of 1 bit, such as an extended Hamming code. Then, the encoding unit 21 writes each code word to the memory 2 via the memory controller 11.

When the error detection unit 22 is instructed to execute the memory error determination processing from the interrupt controller 14, the error detection unit 22 determines whether or not an error occurs in the memory 2. For this purpose, the error detection unit 22 reads, via the memory controller 11, each code word written to each layer of the memory 2, and determines presence or absence of an error for each code word. The processor 16 can determine an address of a memory accessed by the processor 16, and thus the error detection unit 22 can determine the address of the memory in which a code word in which an error occurs is stored. In the present embodiment, the SECDED code is used for generating a code word, and thus the error detection unit 22 can detect, from a bit string acquired by computing a product of a code word of interest and an inspection matrix, a correctable 1-bit error or a 2-bit error in the code word of interest. The error detection unit 22 specifies, in a code word with the correctable 1-bit error detection, a bit address of a memory element in which the detected bit is stored (hereinafter, may be referred to as a memory element in which an error has occurred or a memory element having an error been detected), and an address of a memory region in which a code word with the 2-hit error detection is stored.

The error detection unit 22 notifies, for each layer of the memory 2, the error position specification unit 23 of the bit address of the memory element in which the error has occurred. Furthermore, the error detection unit 22 may notify the error position specification unit 23 of the address of the memory region in which the code word with the 2-bit error detection is stored.

The error position specification unit 23 specifies, for each layer of the memory 2, coordinates in the three-dimensional space of the memory element in which the error has occurred, i.e., an error position. In the present embodiment, the error position specification unit 23 reads a position table from the non-volatile memory 3 via the general-purpose memory controller 12, and refers the position table to specify positional coordinates in the three-dimensional space corresponding to the bit address of the memory element in which the error has occurred, and determine the specified positional coordinates as an error position. Then, the error position specification unit 23 notifies the determination unit 24 of the error position of each memory element in which the error has occurred. Similarly, the error position specification unit 23 may specify the error position of each memory element included in the memory region in which the code word with the 2-bit error detection is stored. Then, the error position specification unit 23 may also notify the determination unit 24 of the error position of each memory element included in the memory region in which the code word With 2-bit error detection is stored.

The determination unit 24 determines whether or not the error that has occurred in the memory 2 is a soft error due to incidence of radiation on the memory 2 on the basis of the error position of each memory element in which the error has occurred.

Figure 3A:
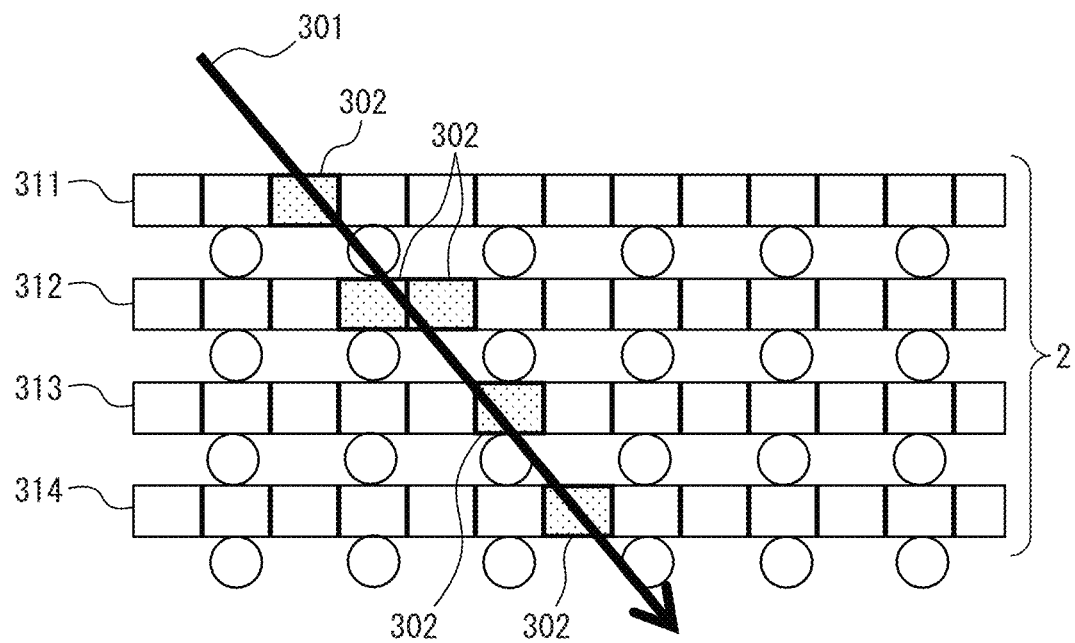
FIG. 3A is a schematic diagram illustrating one example of a distribution of memory elements that result in an error when a soft error occurs in a memory due to radiation.
Figure 3B:
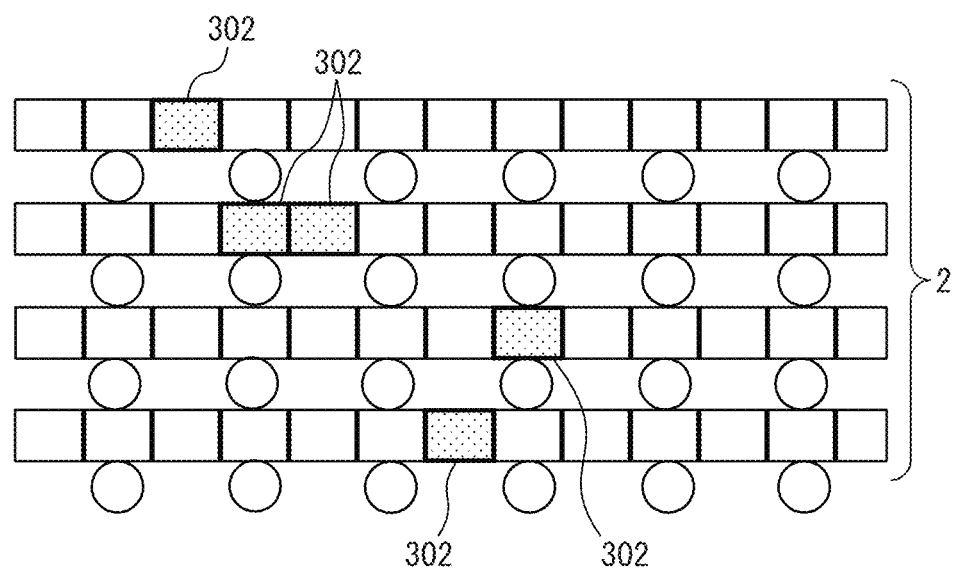
FIG. 3B is a schematic diagram illustrating one example of a distribution of the memory elements that result in an error when an error occurs in the memory due to another reason.

FIG. 3A is a schematic diagram illustrating one example of a distribution of memory elements that result in an error when a soft error occurs in the memory 2 due to radiation. FIG. 3B is a schematic diagram illustrating one example of a distribution of the memory elements that result in an error when an error occurs in the memory 2 due to another reason.

As illustrated in FIG. 3A, when radiation is incident on the memory 2, an incidence path 301 of the radiation is generally a straight line. Therefore, when a soft error occurs in the memory 2 due to the radiation incident on the memory 2, each memory element 302 in which the error has occurred is linearly aligned along the incidence path 301 of the radiation.

On the other hand, as illustrated in FIG. 3B, when an error occurs in the memory 2 due to another reason, each memory element 302 in which the error has occurred is not necessarily linearly aligned.

Thus, the determination unit 24 determines whether or not each position of an individual memory element in which an error has occurred, i.e., each individual error position is linearly aligned across a plurality of layers of the memory 2, and determines that, when the error positions are linearly aligned, the error that has occurred in the memory 2 is a soft error due to incidence of the radiation on the memory 2. In the present embodiment, when a 2-bit error is detected for any code word stored in at least one layer of the memory 2, and a 1-bit error is detected from any code word for three layers or more among the other layers of the plurality of layers of the memory 2 (hereinafter, for convenience of description, referred to as a single bit error layer), the determination unit 24 calculates a straight line connecting error positions of two layers among the single bit error layers. Then, when a predetermined number or more of the error positions on the straight line among the error positions of the single bit error layers is present, the determination unit 24 determines that the each memory element in which the error has occurred is linearly aligned across the plurality of layers of the memory 2. In other words, the determination unit 24 determines that the error that has occurred in the memory 2 is a soft error due to incidence of the radiation on the memory 2. Note that the predetermined number can be, for example, a total number of the single bit error layers, or a number acquired by multiplying a total number of the single bit error layers by a predetermined number less than 1 (for example, 0.5 to 0.9). Further, when a distance between an error position and a straight line is equal to or less than a predetermined distance (for example, a distance corresponding to a pitch between memory elements), the determination unit 24 may determine that the error position is located on the straight line. For example, in the example illustrated in FIG. 3A, only one memory element 302 in which an error has occurred is detected in layers 311, 313, and 314 among layers 311 to 314 of the memory 2. Note that, since an error occurs in a plurality of memory elements in the layer 312, a bit that becomes an error is not specified in relation to a code word stored in the memory elements (i.e., an uncorrectable error is detected in relation to a code word stored in the layer 312). Therefore, since an error position of the memory element 302 of each of the layers 311, 313, and 314 is linearly aligned, the determination unit 24 can determine that the error that has occurred in the memory 2 is a soft error due to incidence of the radiation on the memory 2.

According to a modification example, the determination unit 24 may determine a straight line having a greatest number of error positions located on the straight line by executing Hough transform on a set of error positions of single bit error layers, and may determine that the error that has occurred in the memory 2 is a soft error due to incidence of the radiation on the memory 2 when the number of error positions on the straight line is equal to or greater than the predetermined number.

Further, when the error that has occurred in the memory 2 is caused by incidence of the radiation on the memory 2, there is a high possibility that a memory region in which a code word as a cause of an uncorrectable error, i.e., a code word with a 2-bit error detection is stored is also located on the straight line in which the error positions are aligned. Thus, only when the straight line in which the error positions are aligned passes through the memory region in which the code word being a cause of an uncorrectable error is stored, the determination unit 24 may determine that the error that has occurred in the memory 2 is a soft error due to incidence of the radiation on the memory 2. Note that, in this case, the determination unit 24 may determine, on the basis of a position notified by the error position specification unit 23 in the three-dimensional space of the memory region in which the code word being a cause of an uncorrectable error is stored, whether or not the straight line in which the error positions are aligned passes the memory region.

When the determination unit 24 determines that the error that has occurred in the memory 2 is a soft error due to incidence of the radiation on the memory 2, the determination unit 24 causes the display device 4 to display a message representing the determination result via the communication interface 15. In this way, the determination result is notified to a user. Furthermore, the determination unit 24 may cause the display device 4 to display a message indicating that replacement of hardware is unnecessary.

Figure 4:
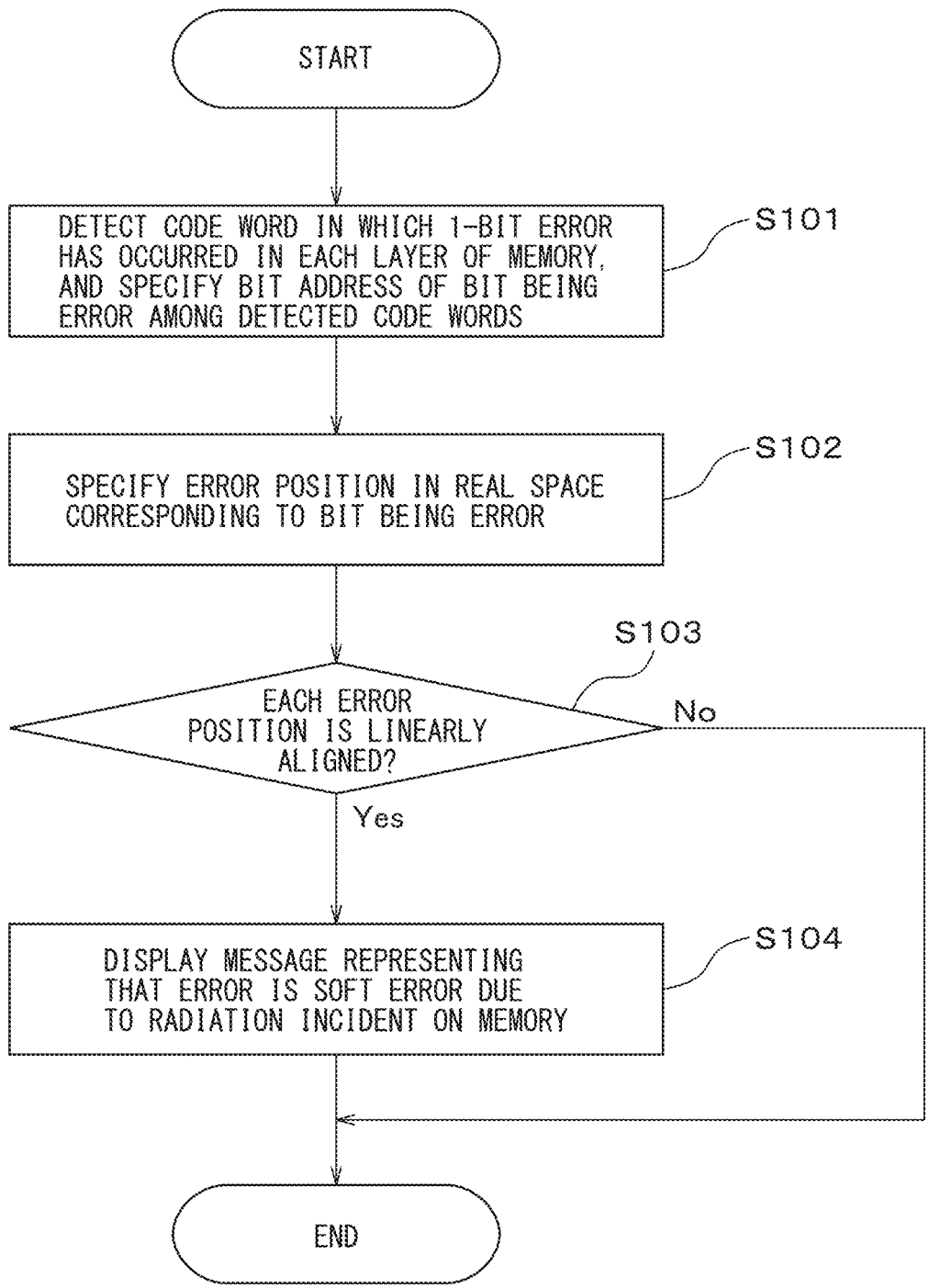
FIG. 4 is an operation flowchart of the memory error determination processing.

FIG. 4 is an operation flowchart of the memory error determination processing. When the processor 16 is instructed to execute the memory error determination processing from the interrupt controller 14, the processor 16 executes the memory error determination processing in accordance with the following operation flowchart.

The error detection unit 22 of the processor 16 detects a code word in which a correctable 1-bit error has occurred among code words stored in each layer of the memory 2, and specifies a bit address of a memory element in which the error has occurred, for each of the detected code words (step S101).

The error position specification unit. 23 of the processor 16 specifies an error position in the three-dimensional space on the basis of the bit address for each memory element in which the error has occurred (step S102).

The determination unit 24 of the processor 16 determines whether or not each specified error position is linearly aligned across the plurality of layers of the memory 2 (step S103). When each specified error position is linearly aligned across the plurality of layers of the memory 2 (step S103—Yes), the determination unit 24 determines that the error that has occurred in the memory 2 is a soft error due to incidence of the radiation on the memory 2. Then, the determination unit 24 causes the display device 4 to display a message representing the determination result via the communication interface 15 (step S104).

After step S104 or when each error position specified in step S103 is not linearly aligned across the plurality of layers of the memory 2 (step S103-No), the processor 16 terminates the memory error determination processing.

As described above, the memory error determination device specifies a position of a memory element in which an error has occurred on the basis of data that are stored in each layer of a memory being three-dimensionally stacked and are encoded by an error detection code or an error correction code. The memory error determination device determines whether or not each memory element in which the error has occurred is linearly aligned across the plurality of layers on the basis of the position of each of the memory elements in which the error has occurred. Then, when each memory element in which the error has occurred is linearly aligned across the plurality of layers, the memory error determination device determines that the error that has occurred in the memory is a soft error due to incidence of radiation on the memory. Thus, the memory error determination device can determine whether or not the error that has occurred in the memory being three-dimensionally stacked is caused by the radiation. As a result, when an uncorrectable error occurs in the memory, it is easy for a user to determine whether replacement of the memory is necessary or unnecessary.

According to a modification example, the determination unit 24 may set, for each layer of the memory 2, one block for every predetermined number of (for example, 3×3 or 5×5) memory elements. Then, when an error has occurred in any one of the memory elements in the block, the determination unit 21 may determine whether or not each error position is linearly aligned across the plurality of layers on the assumption that the error has occurred in all of the memory elements in the block to which the memory element in which the error has occurred belongs.

Figure 5:
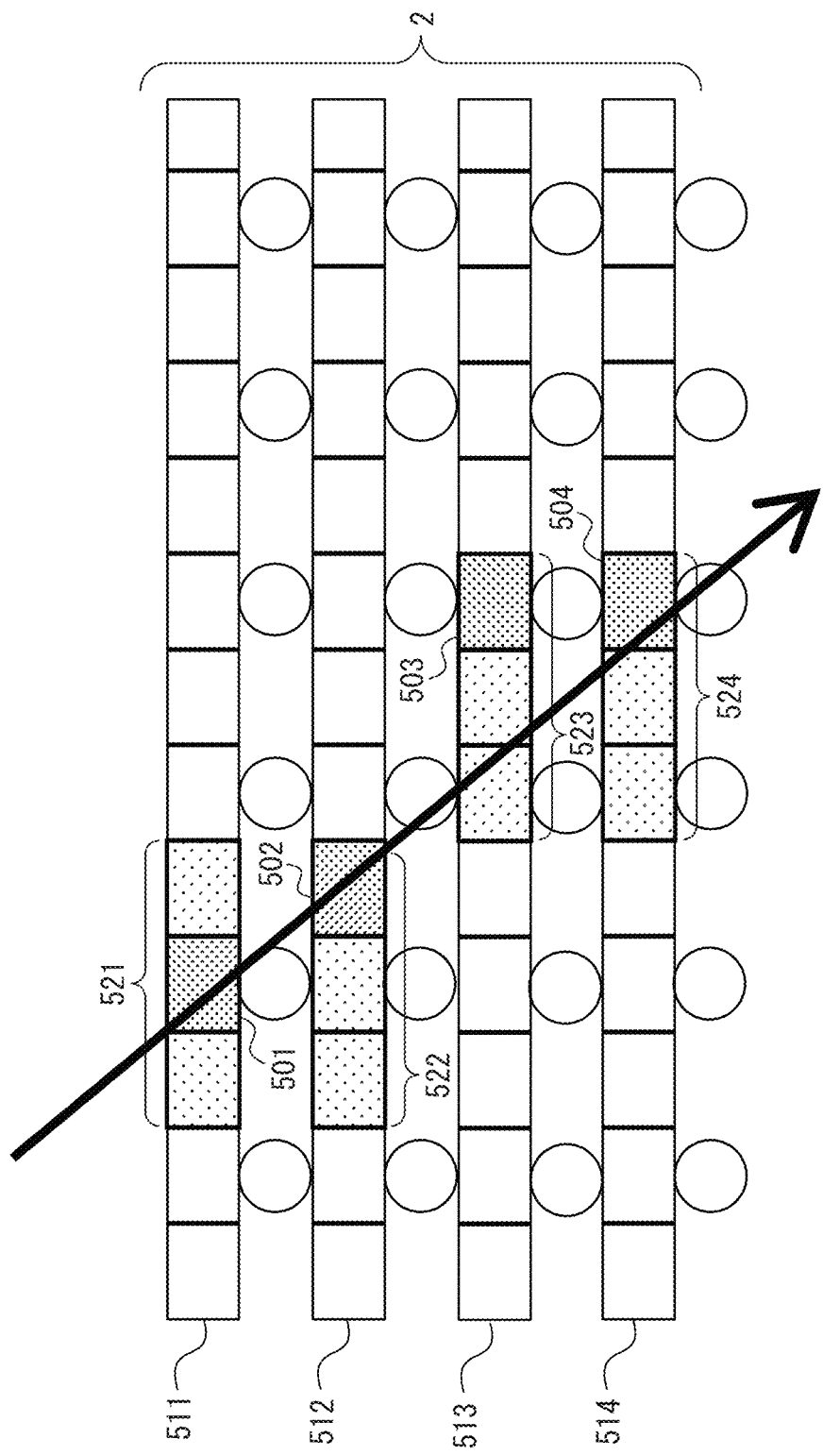
FIG. 5 is a schematic diagram illustrating an outline of the memory error determination processing according to a modification example.

FIG. 5 is a schematic diagram illustrating an outline of the memory error determination processing according to the modification example. In this example, one block is set every three memory elements for layers 511 to 514 of the memory 2. Then, in this example, an error occurs in each of memory elements 501 to 504. Thus, it is regarded that the error occurs in each of the memory elements in a block 521 including the memory element 501 in the layer 511. Similarly, it is regarded that, for each of a block 522 including the memory element 502 in the layer 512, a block 523 including the memory element 503 in the layer 513, and a block 524 including the memory element 504 in the layer 514, the error occurs in each of the memory elements included in the block. Then, in this case, as indicated by an arrow 321, the memory elements in the blocks 521 to 524 are linearly aligned, and thus the determination unit 24 determines that the error that has occurred in the memory 2 is a soft error due to incidence of the radiation on the memory. According to the modification example, even when positions of individual memory elements in which an error has occurred are slightly scattered with respect to a trajectory of radiation incident on the memory 2 due to a position of a silicon atom colliding with the radiation, the determination unit 24 can accurately determine whether or not the error that has occurred in the memory is caused by incidence of the radiation on the memory.

Note that, in the modification example described above, the determination unit 24 may regard an individual block as a memory region into which one code word is written. Further, in this case, the encoding unit 21 may apply, to an individual bit string, an error detection code such as a parity code or a cyclic redundancy check (CRC) code instead of the SECDED code. When an individual block is set as a memory region into which one code word is written, the determination unit 24 can also use a layer including the memory region in which a code word in which an uncorrectable error has occurred is stored, for determination whether or not each error position is linearly aligned across a plurality of layers. Thus, when the number of layers including a memory element in which an error has occurred is three, the determination unit 24 can determine whether or not the error that has occurred in the memory 2 is a soft error due to incidence of radiation on the memory.

Note that it is rare for a plurality of radiation rays to be simultaneously incident on the memory 2. Thus, in the embodiments or the modification examples described above, when an error occurs at a plurality of places different from each other in each of a predetermined number (for example, 2 to 3) or more of layers, i.e., when an error occurs in a plurality of memory elements different from each other, the determination unit 24 may determine that the error that has occurred in the memory 2 is not caused by radiation. However, an error may occur in a plurality of memory elements close to each other in the same layer due to radiation. Thus, when an error occurs in a plurality of memory elements in the same block or two adjacent blocks, the error that has occurred in the plurality of memory elements may be assumed to have occurred at one place. Then, the determination unit 24 may cause the display device 4 to display, via the communication interface 15, a message representing that the error that has occurred in the memory 2 is not caused by the radiation. According to the modification example, the determination unit 24 can suppress false determination that an error that has occurred in a memory due to a cause other than radiation is caused by radiation.

Further, according to another modification example, when a range of a direction of incidence of radiation on the memory 2 is assumed, information representing the range (hereinafter, referred to as an incidence direction range) may be stored in the non-volatile memory 3 or the external storage device in advance. Then, the determination unit 24 may determine whether or not each error position is linearly aligned across a plurality of layers for only a straight line of a direction included in the incidence direction range. Further, in this case, even in a case where the number of layers including a memory element in which an error has occurred is only two, the determination unit 24 may determine that each error position is linearly aligned across the plurality of layers, i.e., the error that has occurred in the memory 2 is a soft error due to incidence of radiation on the memory only when the direction of the straight line connecting the error positions of the two respective layers is included in the incidence direction range.

Further, when the $\alpha$ ray being one type of radiation is incident on the memory 2 and collides with a silicon atom in any layer, a secondary ion is generated from a collision position, and thus an error may occur in a plurality of memory elements around the collision place. In such a case, the layer including the plurality of memory elements in which the error has occurred is more likely to be located at a terminal of a trajectory of the $\alpha$ ray. Thus, according to another modification example, when a plurality of memory elements in which an error has occurred are detected in a layer at either one of ends of a straight line in which error positions in a plurality of layers are aligned, the determination unit 24 may determine that the error that has occurred in the memory 2 is a soft error due to incidence of the $\alpha$ ray on the memory 2. Then, the determination unit 24 may cause the display device 4 to display a message representing the determination result via the communication interface 15.

According to still another modification example, when the determination unit 24 determines that the error that has occurred in the memory 2 is a soft error due to incidence of radiation on the memory 2, the determination unit 24 may store the determination result and the determination date and time as error history information in the external storage device. In this way, a user can check an occurrence frequency of the soft error due to the radiation by referring to the error history information.

According to still another modification example, when the determination unit 24 determines that the error that has occurred in the memory 2 is a soft error due to incidence of radiation on the memory 2, the determination unit 24 determines, for a memory region in which a code word in which an uncorrectable error has occurred is stored, whether or not a bit string corresponding to the code word written into the memory region remains in the internal memory 13. Then, when the bit string remains in the internal memory 13, the determination unit 24 may encode the bit string again and write the bit string into the memory region of the memory 2.

According to still another modification example, the processor 16 may execute the memory error determination processing on the memory 2 every predetermined cycle or at a predetermined timing. In this case, even when an uncorrectable error does not occur in the memory 2, the processor 16 can detect a soft error due to incidence of radiation on the memory 2.

Further, a computer program that achieves a function of each unit of the processor 16 of the memory error determination device 1 according to the embodiments or the modification examples described above may be provided in form of being recorded in a computer-readable portable recording medium, such as a semiconductor memory, a magnetic recording medium, or an optical recording medium.

All examples and conditional language recited herein are intended to have teaching purpose to aid the reader in understanding the concepts contributed by the inventor to the present invention and furthering the art, and are to be construed as being without limitation to such specifically recited examples and conditions nor does the organization of such examples in the specification related to showing of the superiority and inferiority of the invention. Although the embodiment of the present invention is described in detail, it is to be understood that various changes, substitutions, and modifications can be made hereto without departing from the spirit and scope of the invention.

What is claimed is:
1. A memory error determination device comprising:
   a processor configured to
      detect a memory element in which an error has occurred in each of a plurality of layers included in a memory, the plurality of layers being three-dimensionally stacked in the memory;

specify a position of each memory element in which the error has occurred in each of the plurality of layers; and determine that, when the position of each memory element in which the error has occurred is linearly aligned across a predetermined number of layers among the plurality of layers, the predetermined number being two or more, the error that has occurred in the memory is a soft error due to radiation incident on the memory, wherein data stored in the memory are divided into bit strings having a predetermined bit length, and are stored in the memory as a code word obtained by encoding each of the bit strings by using a code having an error correction capacity of 1 bit and an error detection capacity of 2 bits, and when a 2-bit error is detected in a code word stored in any layer among the plurality of layers, the processor is configured to specify a code word in which a 1-bit error is detected, in accordance with the code which is used to encode a code word for each of other layers among the plurality of layers, and specify, as the memory element in which the error has occurred, a memory element in which a bit error is stored.

2. The memory error determination device according to claim 1, wherein the processor is configured to set a block for every predetermined number of memory elements for each of the plurality of layers, regard, as the memory element in which the error has occurred, each memory element of multiple memory elements included in a block to which the memory element in which the error that has occurred belongs, and determine whether or not the position of each memory element in which the error has occurred is linearly aligned along a straight line across the predetermined number or more of layers.

3. The memory error determination device according to claim 2, wherein when a plurality of memory elements in which the error has occurred are present in a layer located at one end of the straight line, the processor is configured to determine that the error that has occurred in the memory is a soft error due to an α ray incident on the memory.

4. The memory error determination device according to claim 2, wherein the predetermined number of memory elements in each block is three or more memory elements.

5. A non-transitory recording medium that stores a memory error determination computer program for causing a computer to execute:

detecting a memory element in which an error has occurred in each of a plurality of layers included in a memory, the plurality of layers being three-dimensionally stacked in the memory;

specifying a position of each of the memory element in which the error has occurred in each of the plurality of layers; and determining that, when the position of each memory element in which the error has occurred is linearly aligned across a predetermined number of layers among the plurality of layers, the predetermined number being two or more, the error that has occurred in the memory is a soft error due to radiation incident on the memory, wherein data stored in the memory are divided into bit strings having a predetermined bit length, and are stored in the memory as a code word obtained by encoding each of the bit strings by using a code having (1) an error correction capacity of 1 bit and (2) an error detection capacity of 2 bits wherein said determining comprises determining, among a plurality of straight lines having memory elements with errors, a straight line having a greatest number of memory elements with errors, and determining that the error that has occurred in the memory is a soft error due to incidence of the radiation on the memory, in response to the greatest number being equal to or greater than the predetermined number.

6. A memory error determination device, comprising:

a processor configured to detect a memory element in which an error has occurred in each of a plurality of layers included in a memory, the plurality of layers being three-dimensionally stacked in the memory;

specify a position of each memory element in which the error has occurred in each of the plurality of layers; and determine that, when the position of each memory element in which the error has occurred is linearly aligned across a predetermined number of layers among the plurality of layers, the predetermined number being two or more, the error that has occurred in the memory is a soft error due to radiation incident on the memory, wherein data stored in the memory are divided into bit strings having a predetermined bit length, and are stored in the memory as a code word obtained by encoding each of the bit strings by using a code having (1) an error correction capacity of 1 bit and (2) an error detection capacity of 2 bits, wherein the processor is further configured to determine, among a plurality of straight lines having memory elements with errors, a straight line having a greatest number of memory elements with errors, and determine that the error that has occurred in the memory is a soft error due to incidence of the radiation on the memory, in response to the greatest number being equal to or greater than the predetermined number.

7. The memory error determination device according to claim 6, wherein when the processor determines that the error that has occurred in the memory is a soft error due to incidence of radiation on the memory, the processor is configured to notify of a result of the determination via a notification device.

8. The memory error determination device according to claim 6, wherein, in response to a determination that the error that has occurred in the memory is a soft error due to incidence of radiation on the memory, the processor is configured to cause a determination result, and date and time of the determination to be stored, as error history information, in an external storage device.

9. The memory error determination device according to claim 6, wherein, in response to determining that the error that has occurred in the memory is a soft error due to incidence of radiation on the memory, the processor is configured to cause a display device to display a message representing whether it is necessary to replace the memory.

10. The memory error determination device according to claim 6, wherein the processor is configured to determine whether there is a soft error due to radiation incident on the memory every predetermined cycle or at a predetermined timing.

\* \* \* \* \*